(12) United States Patent  (10) Patent No.: US 8,991,331 B2
Benjamin  (45) Date of Patent: Mar. 31, 2015

(54) INTEGRATED STEERABILITY ARRAY ARRANGEMENT FOR MINIMIZING NON-UNIFORMITY AND METHODS THEREOF

(71) Applicant: Lam Research Corporation, Fremont, CA (US)

(72) Inventor: Neil Martin Paul Benjamin, Austin, TX (US)

(73) Assignee: Lam Research Corporation, Fremont, CA (US)

( * ) Notice: Subject to any disclaimer, the term of this patent is extended or adjusted under 35 U.S.C. 154(b) by 89 days.

(21) Appl. No.: 13/969,411

(22) Filed: Aug. 16, 2013

(65) Prior Publication Data

US 2013/0334171 A1    Dec. 19, 2013

Related U.S. Application Data

(62) Division of application No. 12/145,378, filed on Jun. 24, 2008, now Pat. No. 8,528,498.

(60) Provisional application No. 60/947,363, filed on Jun. 29, 2007.

(51) Int. Cl.
   *C23C 16/50*     (2006.01)
   *C23C 16/503*    (2006.01)
   (Continued)

(52) U.S. Cl.
   CPC ............... *H05H 1/46* (2013.01); *C23C 16/505* (2013.01); *C23C 16/509* (2013.01); *C23C 16/52* (2013.01); *C23C 16/45563* (2013.01);
   (Continued)

(58) Field of Classification Search
   CPC .... C23C 16/505; C23C 16/509; C23C 16/52; C23C 16/45563
   USPC ........................... 118/118, 723 E, 723, 723 I
   See application file for complete search history.

(56) References Cited

U.S. PATENT DOCUMENTS 4,579,618 A * 4/1986 Celestino et al. ........ 156/345.44
4,590,042 A * 5/1986 Drage ...................... 422/186.06
(Continued)

FOREIGN PATENT DOCUMENTS

| JP | 05102045 A | * | 4/1993 | ............ H01L 21/205 |
| JP | 06037052 A | * | 2/1994 | ............ H01L 21/302 |
| JP | 2001023976 A | * | 1/2001 | ............. H01L 21/31 |

*Primary Examiner* — Rudy Zervigon
(74) *Attorney, Agent, or Firm* — Martine Penilla Group, LLP

(57) ABSTRACT

A method for providing steerability in a plasma processing environment during substrate processing is provided. The method includes managing, power distribution by controlling power being delivered into the plasma processing environment through an array of electrical elements. The method also includes directing gas flow during substrate processing by controlling the amount of gas flowing through an array of gas injectors into the plasma processing environment, wherein individual ones of the array of gas injectors are interspersed between the array of electrical elements. The method further includes controlling gas exhausting during substrate processing by managing amount of gas exhaust being removed by an array of pumps, wherein the array of electrical elements, the array of gas injectors, and the array of pumps are arranged to create a plurality of plasma regions, each plasma region being substantially similar, thereby creating a uniform plasma region across the substrate.

20 Claims, 5 Drawing Sheets

(51) Int. Cl.
*C23C 16/505* (2006.01)
*C23C 16/509* (2006.01)
*C23C 16/455* (2006.01)
*C23F 1/00* (2006.01)
*H01L 21/306* (2006.01)
*H05H 1/46* (2006.01)
*C23C 16/52* (2006.01)
*H01J 37/32* (2006.01)
*C23C 16/06* (2006.01)
*C23C 16/22* (2006.01)

(52) U.S. Cl.
CPC ...... *H01J 37/32366* (2013.01); *H01J 37/3244* (2013.01); *H01J 37/32449* (2013.01); *H01J 37/32834* (2013.01)
USPC ............... 118/695; 118/723 E; 118/723 I; 118/723 R; 118/696; 156/345.33; 156/345.34; 156/345.43; 156/345.44; 156/345.45

(56) References Cited

U.S. PATENT DOCUMENTS

| | | | |
|---|---|---|---|
| 4,793,975 A * | 12/1988 | Drage | 422/186.05 |
| 5,380,396 A * | 1/1995 | Shikida et al. | 216/2 |
| 5,422,139 A * | 6/1995 | Fischer | 427/248.1 |
| 5,522,934 A * | 6/1996 | Suzuki et al. | 118/723 AN |
| 5,531,834 A * | 7/1996 | Ishizuka et al. | 118/723 I |
| 5,532,190 A * | 7/1996 | Goodyear et al. | 438/710 |
| 5,683,548 A * | 11/1997 | Hartig et al. | 438/729 |
| 5,716,451 A * | 2/1998 | Hama et al. | 118/723 I |
| 6,137,231 A * | 10/2000 | Anders et al. | 315/111.21 |
| 6,155,199 A * | 12/2000 | Chen et al. | 118/723 I |
| 6,158,384 A * | 12/2000 | Ye et al. | 118/723 I |
| 6,189,485 B1 * | 2/2001 | Matsuda et al. | 118/723 E |
| 6,203,620 B1 * | 3/2001 | Moslehi | 156/345.35 |
| 6,209,480 B1 * | 4/2001 | Moslehi | 118/723 I |
| 6,245,396 B1 * | 6/2001 | Nogami | 427/562 |
| 6,427,623 B2 * | 8/2002 | Ko | 118/723 E |
| 6,471,779 B1 * | 10/2002 | Nishio et al. | 118/724 |
| 6,511,577 B1 * | 1/2003 | Johnson | 156/345.48 |
| 6,537,418 B1 * | 3/2003 | Muller et al. | 156/345.34 |
| 6,578,515 B2 * | 6/2003 | Sakamoto et al. | 118/723 I |
| 6,632,324 B2 * | 10/2003 | Chan | 156/345.48 |
| 6,764,658 B2 * | 7/2004 | Denes et al. | 422/186.04 |
| 6,821,563 B2 * | 11/2004 | Yudovsky | 427/248.1 |
| 6,821,910 B2 * | 11/2004 | Adomaitis et al. | 438/758 |
| 6,851,384 B2 * | 2/2005 | Yuda et al. | 118/723 ER |
| 6,890,386 B2 * | 5/2005 | DeDontney et al. | 118/715 |
| 6,892,669 B2 * | 5/2005 | Xu et al. | 118/723 E |
| 6,983,892 B2 * | 1/2006 | Noorbakhsh et al. | 239/67 |
| 7,105,100 B2 * | 9/2006 | Goto | 216/58 |
| 7,115,184 B2 * | 10/2006 | Ohmi et al. | 156/345.33 |
| 7,166,233 B2 * | 1/2007 | Johnson et al. | 216/67 |
| 7,452,827 B2 * | 11/2008 | Gianoulakis et al. | 438/778 |
| 7,540,923 B2 * | 6/2009 | Takagi et al. | 118/666 |
| 7,543,546 B2 * | 6/2009 | Shibata et al. | 118/723 E |
| 7,699,932 B2 * | 4/2010 | Miller et al. | 118/715 |
| 7,819,081 B2 * | 10/2010 | Kawasaki et al. | 118/723 E |
| 7,976,631 B2 * | 7/2011 | Burrows et al. | 118/715 |
| 7,976,674 B2 * | 7/2011 | Brcka | 156/345.48 |
| 8,105,440 B2 * | 1/2012 | Nogami | 134/22.18 |
| 8,397,668 B2 * | 3/2013 | Kobayashi et al. | 118/723 E |
| 2001/0006093 A1 * | 7/2001 | Tabuchi et al. | 156/345 |
| 2001/0040100 A1 * | 11/2001 | Wang | 205/220 |
| 2001/0047760 A1 * | 12/2001 | Moslehi | 118/723 I |
| 2003/0106643 A1 * | 6/2003 | Tabuchi et al. | 156/345.35 |
| 2003/0129107 A1 * | 7/2003 | Denes et al. | 422/186.21 |
| 2004/0123803 A1 * | 7/2004 | Strang | 118/723 E |
| 2004/0208804 A1 * | 10/2004 | Hall et al. | 422/186.04 |
| 2004/0216668 A1 * | 11/2004 | Lindfors et al. | 118/715 |
| 2005/0016457 A1 * | 1/2005 | Kawasaki et al. | 118/723 E |
| 2005/0126487 A1 * | 6/2005 | Tabuchi et al. | 118/723 E |
| 2005/0272261 A1 * | 12/2005 | Mashima et al. | 438/680 |
| 2006/0057854 A1 * | 3/2006 | Setsuhara et al. | 438/710 |
| 2006/0234514 A1 * | 10/2006 | Gianoulakis et al. | 438/758 |
| 2008/0166884 A1 * | 7/2008 | Nelson et al. | 438/765 |
| 2008/0173238 A1 * | 7/2008 | Nakashima et al. | 118/723 R |
| 2009/0000738 A1 * | 1/2009 | Benjamin | 156/345.28 |
| 2009/0078677 A1 * | 3/2009 | Benjamin | 216/71 |
| 2009/0081886 A1 * | 3/2009 | Levy et al. | 438/790 |
| 2009/0217878 A1 * | 9/2009 | Levy et al. | 118/729 |
| 2009/0236041 A1 * | 9/2009 | Iizuka | 156/345.34 |

* cited by examiner

INTEGRATED STEERABILITY ARRAY ARRANGEMENT FOR MINIMIZING NON-UNIFORMITY AND METHODS THEREOF

This application is a divisional and claims priority under 35 U.S.C §120 to a previously filed patent application entitled, "INTEGRATED STEERABILITY ARRAY ARRANGEMENT FOR MINIMIZING NON-UNIFORMITY", filed on Jun. 24, 2008 by Neil Benjamin, application Ser. No. 12/145,378, which is related to and claims priority under 35 U.S.C. §119(e) to a commonly assigned provisional patent application entitled "Integrated Steerability Array Arrangement For Minimizing Non-Uniformity," by Neil Benjamin, application Ser. No. 60/947,363 filed on Jun. 29, 2007, all incorporated by reference herein.

BACKGROUND OF THE INVENTION

Plasma processing systems have long been employed to process substrates to produce semiconductor devices. During substrate processing, conditions of the chamber have to be closely monitored and carefully controlled in order to create a processing environment that is conducive for creating delicate semiconductor devices. Generally speaking, manufacturers may need to create as processing environment in which the conditions are uniform in order to process a substrate.

Unfortunately, certain conditions that may exist in the processing chamber during substrate processing may cause non-uniformity. To facilitate discussion, FIG. 1 shows a simplified block diagram of a substrate processing environment 100. A substrate 106 is placed on top of an electrostatic chuck (ESC) 108 within a processing chamber 104. Power is delivered into processing chamber 104. In an example, radio frequency (RF) power 110 may be fed into processing chamber 104 via an electrostatic chuck. Within processing chamber 104, the RF power may interact with gas, which may be delivered into processing chamber 104 via a gas delivery system 102, to produce plasma 114, which may interact with substrate 106 to produce etched semiconductor products.

Ideally, the conditions within processing chamber 104, especially across substrate 106, are uniform in order to provide a uniform processing environment for processing substrate 106. However, due to the design of processing chamber 104, the conditions within the processing chamber are usually non-uniform. In an example, the radial flow of gas may cause non-uniform distribution of gas throughout the processing chamber. In another example, the gas exhaust may be non-uniformly pumped out of processing chamber 106 because a pump 112 is usually located away from the center of the substrate. Accordingly, the gas exhaust is being pumped out and downward from the center to the edge of the substrate. As a result, the gas may be non-uniformly distributed across the surface of the substrate. In an example, the gas may be less dense toward the edge of the substrate.

One method that has been employed to create a more uniform processing environment may be performed using a transformer coupled plasma (TCP) source. FIG. 2 shows a simple block diagram of a processing environment 200 utilizing a TCP source. Usually, a TCP source produces an inductive environment. Thus, instead of electrodes, set of antenna 202 may be employed to deliver power to the processing environment.

Within TCP source, plasma 206 may be generated with a doughnut shape to form a toroidal processing region. The toroidal processing region results in a radial diffusion profile over a substrate 208. However, even with a radial diffusion profile, the conditions may not be quite uniform. A larger toroidal processing region may produce a more uniform processing environment; however, a larger toroidal processing region may require the chamber to be significantly larger and the dielectric window to be larger. Accordingly, the cost associated with such an arrangement may not be financially feasible and the engineering may be significantly more difficult.

BRIEF SUMMARY OF THE INVENTION

The invention relates, in an embodiment, to an integrated steerability array arrangement for managing plasma uniformity within a plasma processing environment to facilitate processing of a substrate. The arrangement includes an array of electrical elements. The arrangement also includes an array of gas injectors, wherein the array of electrical elements and the array of gas injectors are arranged to create a plurality of plasma regions, each plasma region of the plurality of plasma regions being substantially similar. The arrangement further includes an array of pumps, wherein individual one of the array of pumps being interspersed among the array of electrical elements and the array of gas injectors. The array of pumps is configured to facilitate local removal of gas exhaust to maintain a uniform plasma region within the plasma processing environment.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
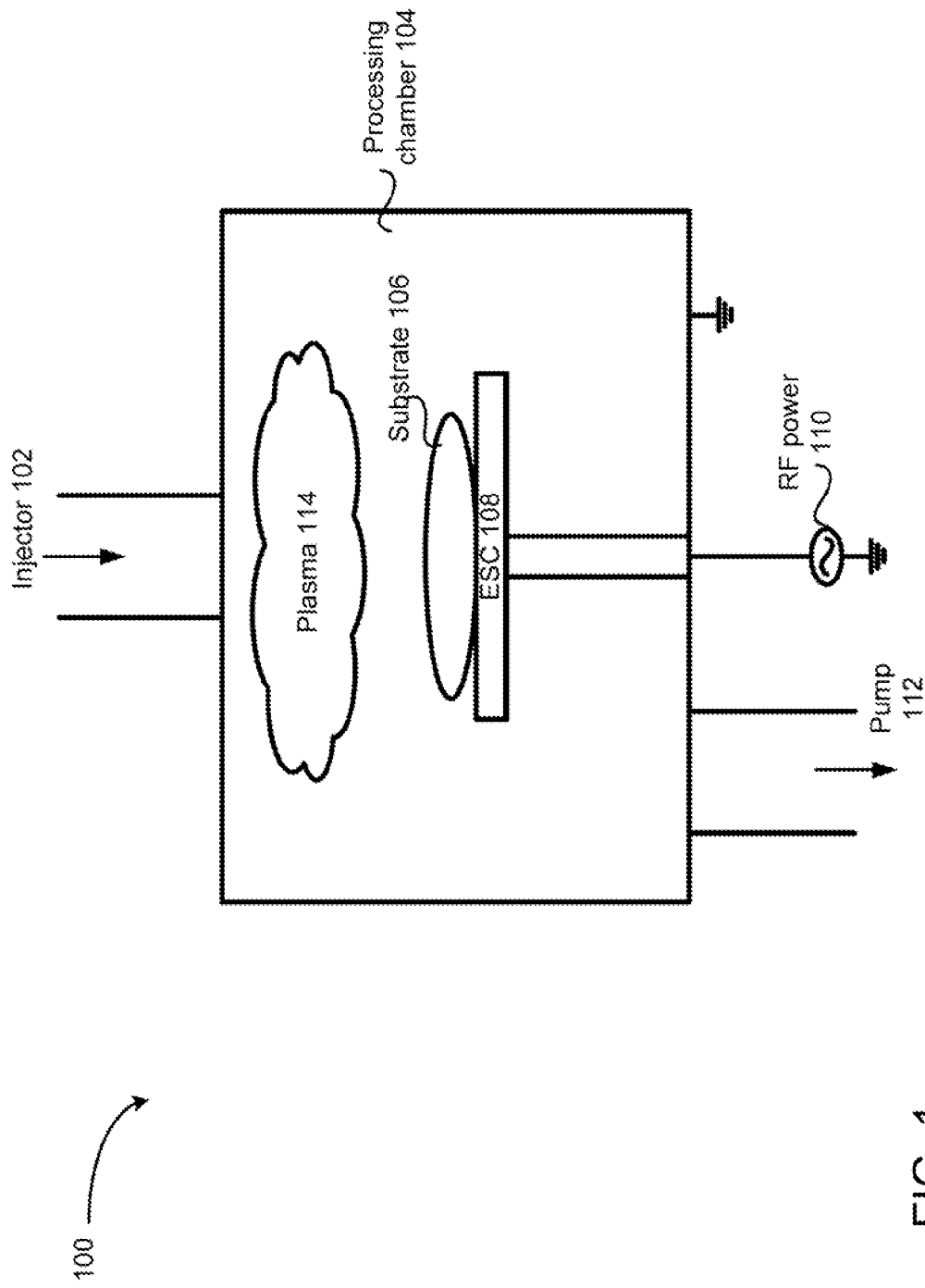
FIG. 1 shows a simplified block diagram of a substrate processing environment.
Figure 2:
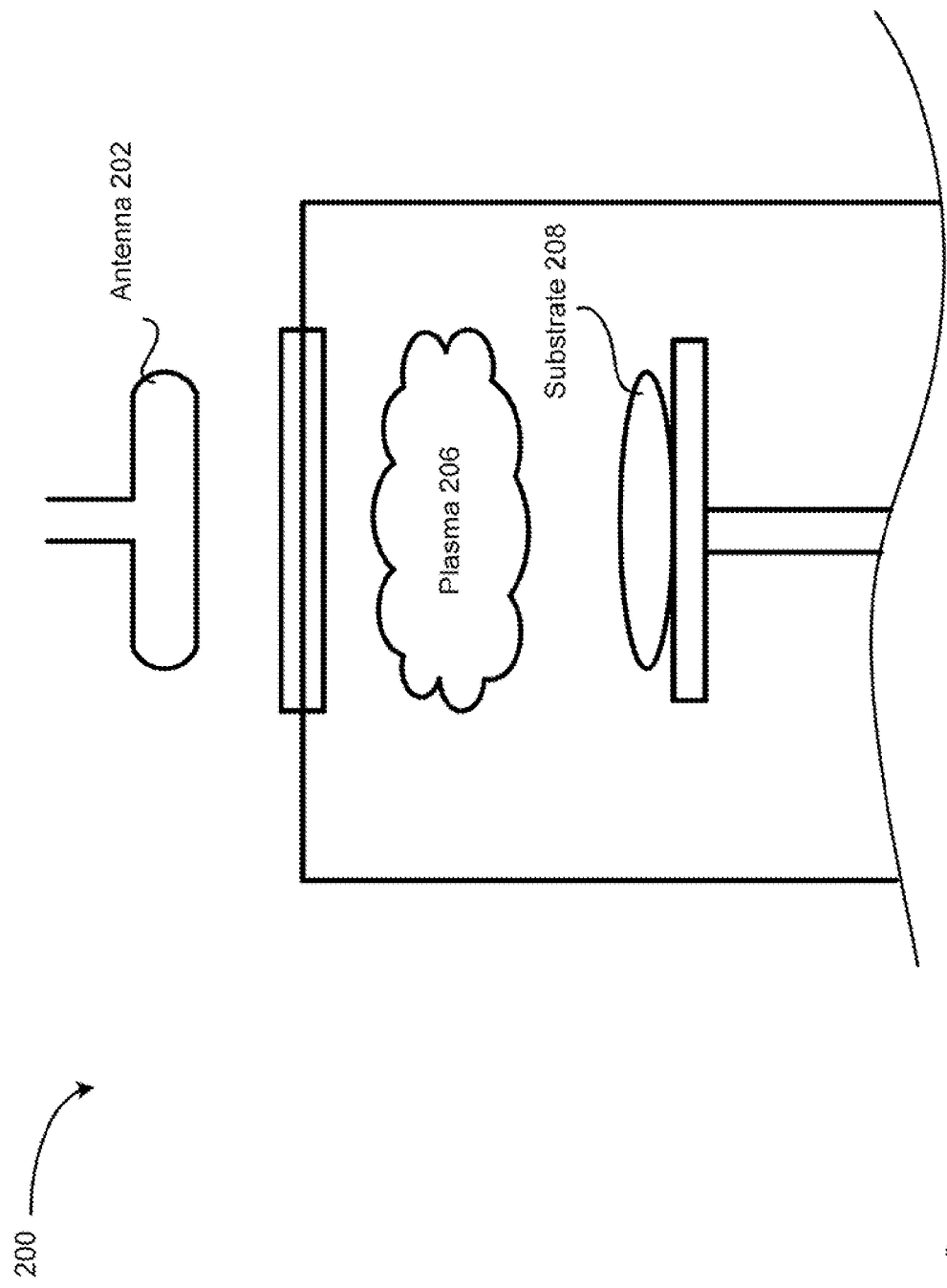
FIG. 2 shows a simple block diagram of a processing environment within a TCP source.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for staring computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In one aspect of the invention, the inventor herein realized that steerability is required in order to achieve more uniform processing. As discussed herein, steerability refers to local uniformity control that may be radial author azimuthal control. To achieve steerability, an array of elements may be implemented.

In the prior art, IC fabricators have attempted to control uniformity by controlling the different parameters (e.g., gas flow, gas exhaust, RF energy distribution, etc.) that may affect the condition of the processing chamber. In an example, IC fabricators may employ a Drytec triode machine to control the delivery of power into the processing chamber. A Drytec triode machine includes three electrodes with the middle electrode being an array of small electrodes. Control may be available to direct the flow of power through the middle electrode. However, even with the Drytec triode machine, non-uniformity remains a problem because the Drytec triode machine does not provide local delivery of the other parameters, such as gas flow and gas exhaust.

As aforementioned, a traditional plasma system may be configured to have a single gas injector delivering gas into the processing chamber and a single pump for removing the gas exhaust. IC fabricators have manipulated the parameters in an attempt to create a more uniform processing environment. In an example, a process engineer may control the speed of the gas flow in an attempt to generate to more even distribution of gas. Manipulating the different parameters in order to produce more uniform plasma is as tedious and time-consuming process and tends to require a high degree of precision and involve balancing many sources of non-uniformity against one another while maintaining desirable etch rate, etch profile, selectivity, and other parameters.

In accordance with embodiments of the invention, an integrated steerability array arrangement is provided for enabling local control during substrate processing. Embodiments of the invention provide steerability by creating individually controlled set of processing regions.

In an embodiment of the invention, the integrated steerability array arrangement may include a variety of configurations. The configurations may be symmetrical patterns in order to provide a more uniform processing environment, in an embodiment. Examples of configurations may include, but are not limited to, a rectangular pattern, a circular pattern, a hexagonal pattern, and the like.

In an embodiment of the invention, the integrated steerability array arrangement may include an array of electrical elements, an array of gas injectors, and/or an array of pumps interspersed among one another to create individually controlled set of processing regions. Consider the situation wherein, for example, power is delivered through an array of electrical elements and gas is being injected into the processing chamber through an array of gas injectors. The array of electrical elements and gas injectors may be arranged in a manner that facilitates the productions of a plurality of small plasma regions that are self-similar over the substrate. Thus, the amount of power and/or gas that may be required to create a uniform processing environment across the substrate being processed may be locally controlled.

Further, to maintain the uniform condition of the processing environment, an array of pumps or one or more pumps, each with a plurality of pumping ports connected to a manifold, may be interspersed among the arrays of electrical elements/gas injectors in order to facilitate local removal of gas exhaust, in an embodiment. Each port may be fixed or may be controllable (e.g., via a valve). Unlike the prior art, by having the pumps located in close proximity to the gas injectors, the gas may be pumped in and out locally instead of being pumped radially outward from the position typically above or under the substrate. Also, the speed of the pumps may be individually controlled, enabling the flow of gas exhaust to be adjusted according to the need of each small plasma region.

The features and advantages of the present invention may be better understood with reference to the figures and discussions that follow.

Figure 3:
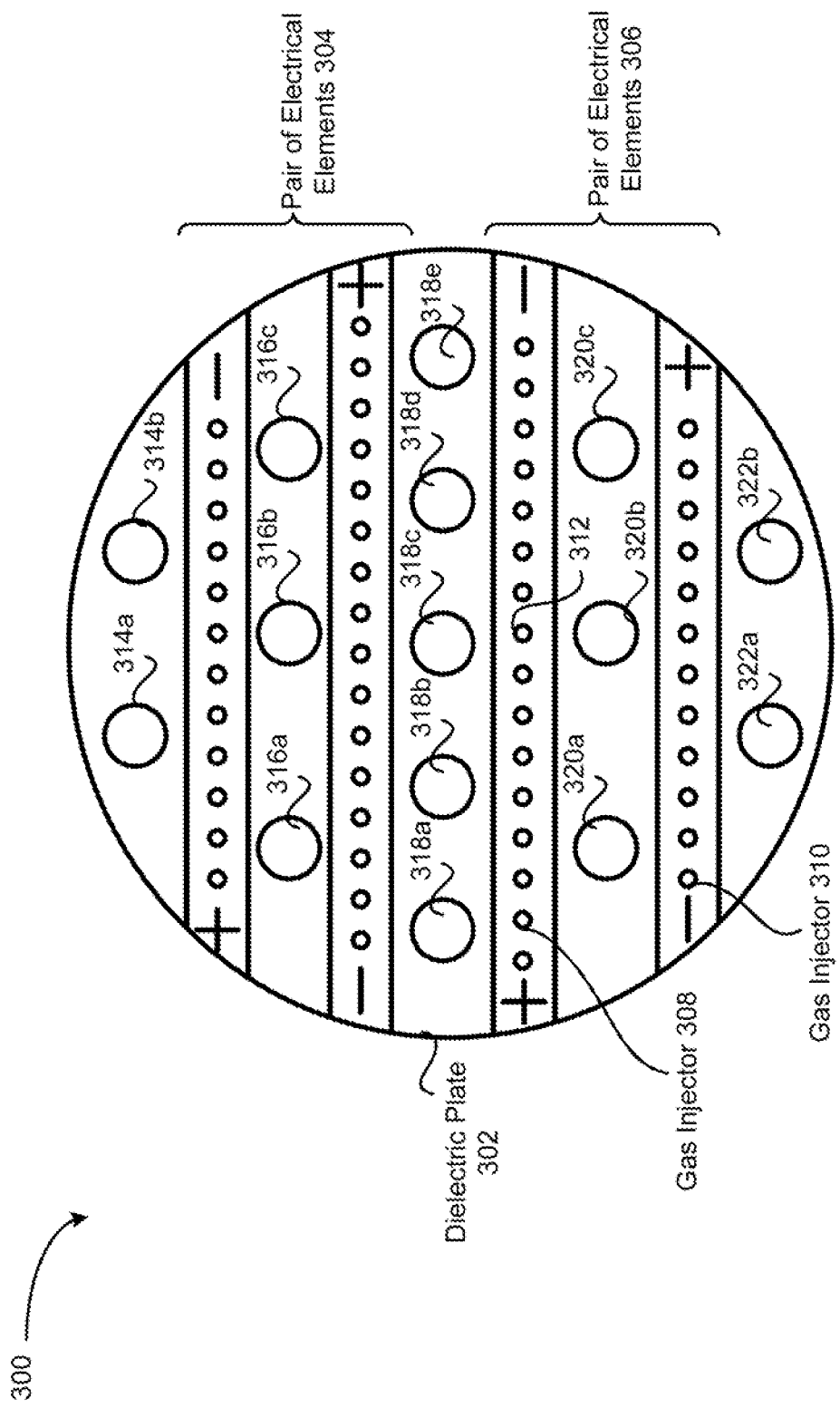
FIG. 3 shows, in an embodiment of the invention, a simple diagram illustrating a top view of an integrated steerability array arrangement.

FIG. 3 shows, in an embodiment of the invention, a simple diagram illustrating a top view of an integrated steerability array arrangement. An integrated steerability array arrangement 300 may include a dielectric plate 302 with an array of electrical element pairs, such as a pair of electrical elements 304 and 306, embedded into dielectric, plate 302. In an embodiment, the array of electrical element pairs may be a pair of capacitive elements (e.g., parallel plates). In another embodiment, the array of electrical element pairs may be a pair of inductive elements (e.g. antenna). The array of electrical element pairs may be arranged in a plurality of configurations, such as a ladder arrangement. In an example, each electrical element pair is arranged in a push-pull ladder arrangement in order to create a balanced power arrangement.

Intersperse among the array of pair of electrical elements are arrays of gas injectors from which gas may be delivered into the processing chamber. In an example, pair of electrical elements 306 may include an array of gas injectors (e.g., 308, 310, 312, etc). By having the array of gas injectors interspersed between the array of electrical element pairs, the amount of gas and power delivered into the processing chamber may be individually controlled during substrate processing.

In the prior art, due to the nature of the substrate and due to the configuration of the processing chamber (e.g., edge ring), the plasma tends to be less uniform toward the edge of the substrate. Since prior art configuration may not include an array of gas injectors, the process engineer may not be able to locally control the amount of gas being delivered into specific areas of the processing chamber. With the arrays of electrical element pairs and/or gas injector pairs, steerability may be performed to direct the flow of power and/or gas into specific areas of the processing chamber. In an example, the processing region around gas injector 310 (such as the edge of the substrate) may require more gas and/or power than the processing region around gas injector 312 (such as the center of the substrate). With the integrated steerability array arrangement, the flow of gas and/or power may be steered in order to create a more uniform processing environment.

In an embodiment, a set of pumps may be interspersed within the integrated steerability array arrangement. In an example, a set of pumps may be positioned between an array of electrical element pairs. In an embodiment, the set of pumps may be an array of pumps (314a, 314b, 316a, 316b, 316d, 318a, 318b, 318c, 318d, 318e, 320a, 320b, 320c, 322a, and 322b or one or more pumps, each with a plurality of pumping ports connected to a manifold. Each port may be fixed or may be controllable (e.g., via a valve). By having the set of pumps located within close proximity to the array of gas injectors, the gas exhaust may be removed from the processing chamber in a manner that produce a more uniform processing environment. In the prior art, a pump may be located near the edge of the substrate resulting in gas exhaust being pumped outward and downward from the substrate, thereby creating a processing environment in which the gas is less dense at the edge of the substrate. However, with a set of pumps, the pump speed may be controlled locally enabling the amount of gas exhaust being removed to be individually controlled, thereby maintaining a balance of gas within the processing environment. In an example, due to the inherent nature of the processing chamber, gas tends to be less dense near the edge of a substrate. Thus, the pumps in the area around the edge of the substrate may be pumping at a slower speed than the pumps toward the center of the substrate in order to reduce the amount of gas being removed at the edge.

Figure 4:
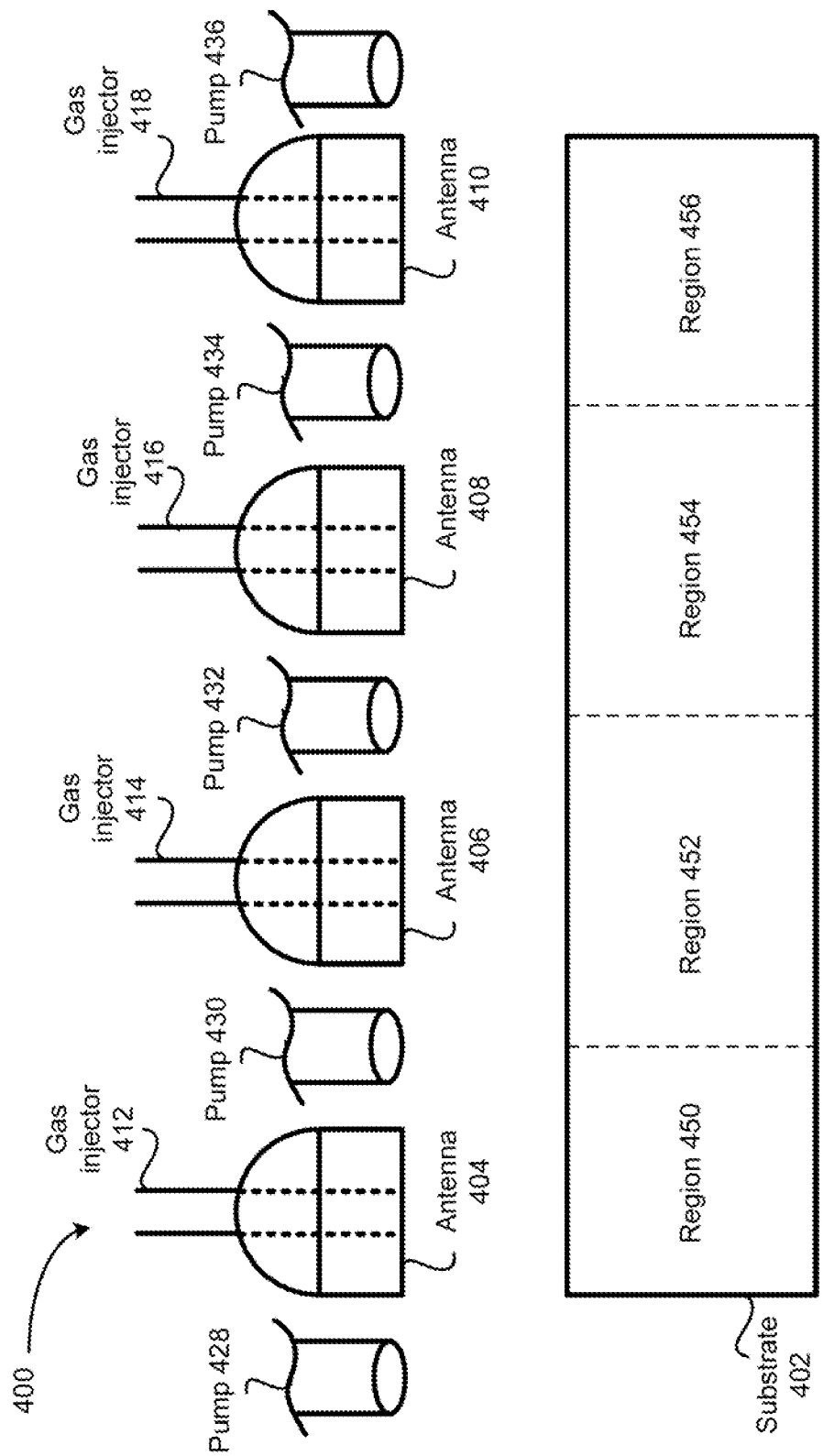
FIG. 4 shows, in an embodiment of the invention, a cross-sectional view of an integrated steerability array arrangement.

FIG. 4 shows, in an embodiment of the invention, a cross-sectional view of an integrated steerability array arrangement 400. Consider the situation wherein, for example, a substrate 402 is being processed. Power (e.g., RF power, microwave power, etc.) may be delivered into the processing chamber via an array of antenna (as shown by antenna 404, 406, 408, and 410). Interspersed among the array of antenna is an array of gas injectors (412, 414, 416, and 418) from which gas may be delivered into the processing environment to interact with the power to create plasma. Similarly, an array of pumps (428, 430, 432, 434, and 436) may be interspersed among the arrays of antenna. Each pump has a plurality of pumping ports (428a, 430a, 432a, 434a, and 436a).

With an integrated steerability array arrangement, steerability is provided thereby enabling the flow of power, gas, and gas exhaust to be locally controlled. In other words, the flow of power, gas, and gas exhaust may be adjusted such that a uniform processing environment is provided over the different regions (450, 452, 454, and 456) of substrate 402 to enable a more precise and accurate processing of the substrate.

Figure 5:
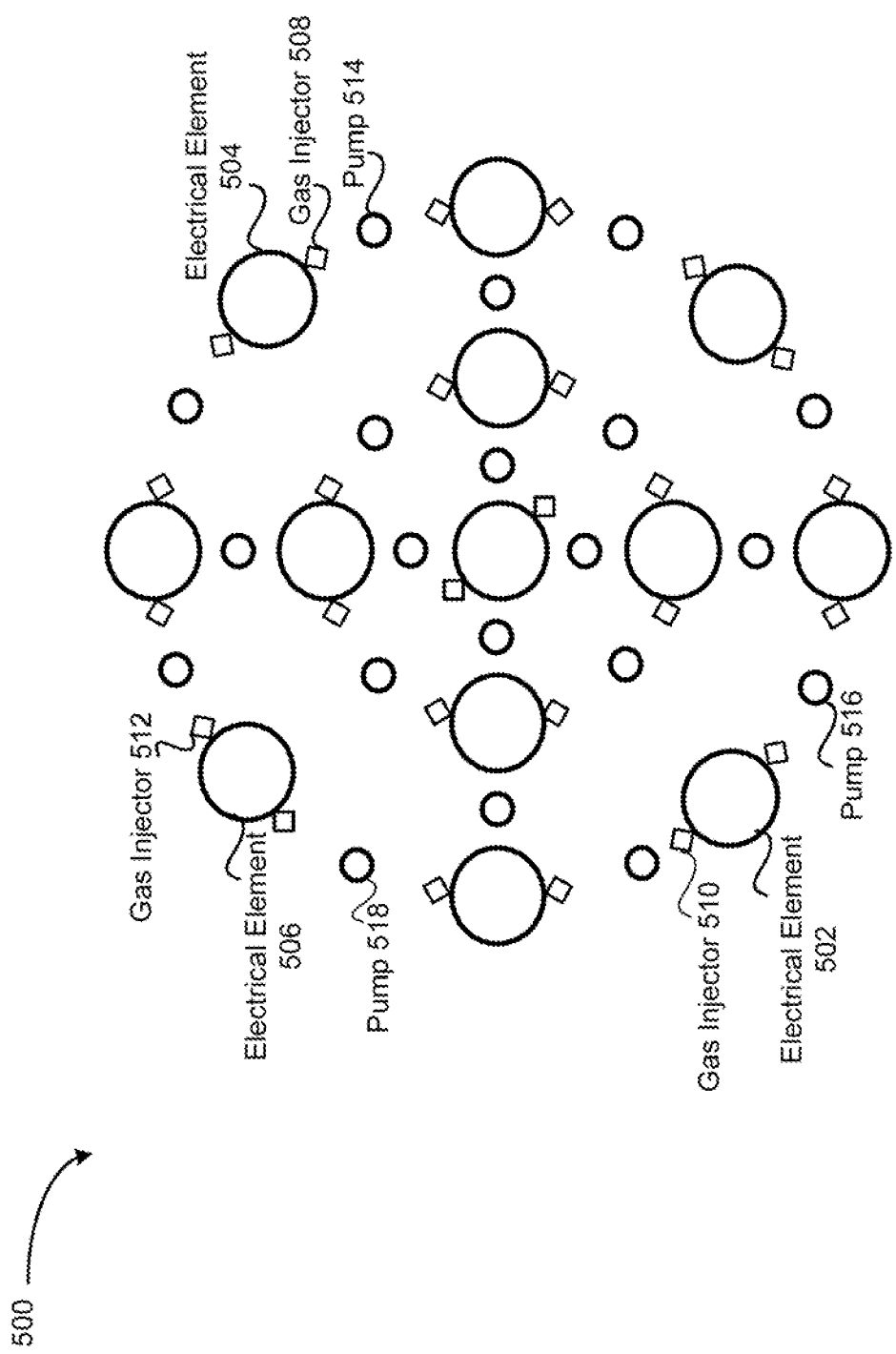
FIG. 5 shows, in an embodiment of the invention, an example of an integrated steerability array arrangement with a concentric configuration.

As aforementioned, integrated steerability array arrangement may be in different configurations. FIG. 5 shows, in an embodiment of the invention, an example of an integrated steerability array arrangement with a concentric configuration. Integrated steerability array arrangement 500 may include an array of electrical elements (e.g., 502, 504, 506, etc.) arranged as concentric rings with a center. Interspersed among the array of electrical elements are an array of gas injectors (e.g., 508, 510, 512, etc.) and an array of pumps (e.g., 514, 516, 518, etc.). Steerability may be achieved by adjusting the flow of power, gas, and gas exhaust locally. With an integrated steerability array arrangement, each component of the arrays may be individually adjusted to create small plasma regions that are self-similar across the surface of the substrate.

As can be appreciated from the foregoing, embodiments of the invention enable an integrated local control arrangement to effectively create a more uniform substrate processing environment. By implementing an integrated steerability array arrangement, steerability may be employed to direct the flow of power, gas, and gas exhaust within the processing chamber. With steerability, local controls are provided creating a more uniform processing environment. Thus, different regions on a substrate are self-similar enabling more precise, accurate, and uniform processing of the substrate. Accordingly, with a more uniform processing environment, overall cost-savings may be achieved due to less defective devices being created.

As can be appreciated from the foregoing, the arrays of electrical elements are self-similar arrays, in an embodiment. In other words, the arrays of electrical elements enable local control of the plasma to create the same processing condition across the substrate. In another embodiment, the conditions may be intentionally manipulated to present different processing, conditions at different portions of the substrate. In so doing, non-uniformity problems that are common in the prior art, such as the substrate edge experiencing a different plasma than the center of the substrate, may be fixed by local control compensating. Also, if the non-uniformity of the incoming substrate is known (e.g., via lithography), the local control can be adjusted such that the outgoing substrate is more uniform than the incoming substrate.

There may still be a residual non-uniformity at the edge. This non-uniformity may be confined to the scale length of the elements disposed close to the edge and may be addressed by other techniques.

While this invention has been described in terms of several preferred embodiments, there are alterations, permutations, and equivalents, which fall within the scope of this invention. Although various examples are provided herein, it is intended that these examples be illustrative and not limiting, with respect to the invention.

Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fail within the true spirit and scope of the present invention.

What is claimed is:

1. A method for providing steerability in a plasma processing environment during processing of a substrate, comprising:
    managing power distribution during said processing of said substrate by controlling power being delivered, into said plasma processing environment through an array of electrical elements;
    directing gas flow during said processing of said substrate, said directing including controlling amount of gas flowing through an array of gas injectors into said plasma processing environment, individual ones of said array of gas injectors being interspersed between said array of electrical elements; and
    controlling gas exhausting during said processing of said substrate by managing amount of gas exhaust being removed by an array of pumps, wherein said array of electrical elements, said array of gas injectors, and said array of pumps are arranged to create a plurality of plasma regions, each plasma region of said plurality of plasma regions being substantially similar thereby creating a uniform plasma region across said substrate.

2. The method of claim 1 wherein said array of electrical elements is arranged on a dielectric plate.

3. The method of claim 2 wherein said array of electrical elements is an array of electrical element pairs.

4. The method of claim 3 wherein said array of electrical element pairs is an array of capacitive element pairs.

5. The method of claim 2 wherein said array of electrical element pairs is an array of inductive element pairs.

6. The method of claim 2 wherein individual ones of said array of electrical element pairs is arranged in a push-pull ladder arrangement.

7. The method of claim 6 wherein said array of electrical elements is arranged as concentric rings with a center and interspersed between said array of electrical elements is said array of gas injectors and said array of pumps.

8. The method of claim 4 wherein said array of capacitive element pairs is an array of parallel plate pairs.

9. The method of claim 5 wherein said array of inductive element pairs is an array of antenna pairs.

10. The method of claim 1 wherein said array of electrical elements, said array of gas injectors, and said array of pumps form an integrated array arrangement that has a symmetrical pattern.

11. The method of claim 1 wherein said array of electrical elements, said array of gas injectors, and said array of pumps form an integrated, array arrangement that has a concentric configuration.

12. The method of claim 1 wherein said array of electrical elements, said array of gas injectors, and said array of pumps form an integrated array arrangement that has a rectangular configuration.

13. The method of claim 1 wherein said array of electrical elements, said array of gas injectors, and said array of pumps form an integrated array arrangement that has a polygonal configuration.

14. A method for providing steerability in a plasma processing environment during processing of a substrate, comprising:

managing power distribution during said processing of said substrate by controlling power being delivered into said plasma processing environment through an array of electrical elements;

directing gas flow during said processing of said substrate, said directing including controlling amount of gas flowing through an array of gas injectors into said plasma processing environment, individual ones of said array of gas injectors being configured to be independently controllable; and controlling gas exhausting during said processing of said substrate by managing amount of gas exhaust being removed by an array of pumps, wherein said array of electrical elements, said array of gas injectors, and said array of pumps are arranged to create a plurality of plasma regions, each plasma region of said plurality of plasma regions being substantially similar, thereby creating a uniform plasma region across said substrate.

15. The method of claim 14 wherein said array of electrical elements, said array of gas injectors, and said array of pumps form an integrated array arrangement that has a symmetrical pattern.

16. The method of claim 14 wherein said array of electrical elements, said array of gas injectors, and said array of pumps form an integrated array arrangement that has a concentric configuration.

17. The method of claim 14 wherein said array of electrical elements, said array of gas injectors, and said array of pumps form an integrated array arrangement that has a rectangular configuration.

18. The method of claim 14 wherein said array of electrical elements, said array of as injectors, and said array of pumps form an integrated array arrangement that has a polygonal configuration.

19. The method of claim 14 wherein individual ones of said array of electrical elements are configured to be independently controllable.

20. The method of claim 14 wherein said array of electrical elements is arranged as concentric rings with a center and interspersed between said array of electrical elements is said array of gas injectors and said array of pumps.

* * * * *